(12) United States Patent
Hornung et al.

(10) Patent No.: US 7,251,138 B2
(45) Date of Patent: Jul. 31, 2007

(54) THERMAL MANAGED INTERCONNECT SYSTEM FOR A CIRCUIT BOARD

(75) Inventors: Craig Warren Hornung, Harrisburg, PA (US); Ralph Edward Spayd, Jr., Elizabethtown, PA (US); Stephen Del Prete, Rehoboth, MA (US); Chong Sheng Wang, Mansfield, MA (US)

(73) Assignee: Tyco Electronics Corporation, Middletown, PA (US)

( * ) Notice: Subject to any disclaimer, the term of this patent is extended or adjusted under 35 U.S.C. 154(b) by 266 days.

(21) Appl. No.: 10/925,091

(22) Filed: Aug. 24, 2004

(65) Prior Publication Data

US 2006/0044763 A1    Mar. 2, 2006

(51) Int. Cl.
*H05K 7/20* (2006.01)
(52) U.S. Cl. .................. 361/704; 361/707; 361/719; 257/706; 257/707; 257/712; 165/80.3
(58) Field of Classification Search ............. None
See application file for complete search history.

(56) References Cited

U.S. PATENT DOCUMENTS

| 5,833,472 | A | * | 11/1998 | Bright | 439/70 |
| 5,866,943 | A | * | 2/1999 | Mertol | 257/712 |
| 6,111,313 | A | * | 8/2000 | Kutlu | 257/697 |
| 6,512,675 | B1 | * | 1/2003 | Tarter et al. | 361/714 |
| 6,529,378 | B2 | * | 3/2003 | Wong et al. | 361/704 |
| 6,563,213 | B1 | * | 5/2003 | Wong et al. | 257/727 |
| 6,626,681 | B2 | * | 9/2003 | Chiu | 439/70 |
| 6,657,864 | B1 | * | 12/2003 | Dyckman et al. | 361/704 |
| 6,992,891 | B2 | * | 1/2006 | Mallik et al. | 361/704 |
| 7,030,484 | B1 | * | 4/2006 | Zheng et al. | 257/706 |

\* cited by examiner

*Primary Examiner*—Boris Chervinsky

(57) ABSTRACT

A thermal management system for an IC device mounted on a circuit board is provided. The system includes a socket housing and an array of power contacts disposed within the housing. The power contacts deliver power to an underside of the IC device and generate heat at the underside of the IC device. A heat conducting interface conveys heat from the underside of the IC device to a heat sink positioned above the IC device.

7 Claims, 5 Drawing Sheets

THERMAL MANAGED INTERCONNECT SYSTEM FOR A CIRCUIT BOARD

BACKGROUND OF THE INVENTION

The invention relates generally to power delivery in electronic circuits and more particularly to thermal management of heat associated with an electronic component.

Competition and consumer demand have continued the trends toward faster, higher performance electrical systems, particularly with regard to computer systems. As microprocessors and associated integrated circuits (IC's) operate at higher speeds, the power requirements for these devices also increase. The speed of the microprocessor is influenced by how quickly the microprocessor's internal transistors can switch on and off. Lowering the operating voltage enables faster switching and correspondingly higher speeds. However, as the operating voltage is reduced, operating currents are increased to maintain power to the associated integrated circuits. Increasing current can result in undesirable power drain or power losses.

Modern high speed IC devices, including microprocessors, which is sometimes referred to as a central processing unit ("CPU"), application specific integrated circuits (ASIC's), memory sockets, or power connectors, and the like, generate large amounts of heat during operation which must be removed from the device in operation, otherwise, unstable operation or damage to the device may result. In the case of a CPU, for example, a heat sink is typically mounted above the CPU along with a fan to dissipate heat from the heat sink to the surrounding atmosphere, thus enhancing the CPU cooling process. This internally generated heat, however, is not the only concern for the CPU and other IC devices. There is an additional heat load associated with the delivery of power for running the IC device. As the IC devices become more and more powerful with more and more transistors, power requirements go up dramatically. As the power requirement of the IC device increases, so does the need to eliminate additional heat from beneath the device. The additional heat travels from a motherboard to the IC device and from the IC device to the motherboard through a socket in which the device is mounted. This additional heat can represent a significant thermal load. That load affects the conductivity of the socket contacts and the communication speed of the IC device and supporting motherboard traces. While much effort has gone into thermal management above the IC device, little has been done to remove heat from beneath the device.

BRIEF DESCRIPTION OF THE INVENTION

In one aspect, a thermal management system for an IC device mounted on a circuit board is provided. The system includes a socket housing and an array of power contacts disposed within the housing. The power contacts deliver power to an underside of the IC device and generate heat at the underside of the IC device. A heat conducting interface conveys heat from the underside of the IC device to a heat sink positioned above the IC device.

Optionally, the power contacts are encased in a thermally conductive material. The heat conducting interface can include a metallic strip extending through the array of power contacts, the strip including first and second opposite ends that extend beyond the housing to engage a lower surface of the heat sink. Alternatively, the heat conducting interface can include a metallic strip extending through the array of power contacts, and a thermal connector coupled to the ends of the strip. The thermal connector can include a post received in a cavity in the heat sink. The heat conducting interface may also include a thermally conductive inlay disposed within the circuit board and at least one thermally conductive link extending through the circuit board and the inlay to engage the heat sink.

In another aspect, a thermal management system for an IC device mounted on a circuit board is provided that includes a socket housing that has a plurality of electrical contacts, a portion of the contacts being an array of power contacts and a thermal conduit in communication with the array of power contacts. The thermal conduit is configured to be coupled to a heat sink to conduct heat away from the array of power contacts.

In another aspect, a thermal management system for an IC device mounted on a circuit board is provided that includes a socket housing, the socket housing defining a heat path therethrough. A plurality of power contacts is disposed in the housing such that the heat path receives heat energy from the power contacts and a thermal link thermally couples the heat path to a heat sink external of the socket housing.

In another aspect, a thermal management system for an IC device mounted on a circuit board includes a socket housing and an array of power contacts disposed within the housing. The power contacts deliver power to an underside of the IC device and generate heat at the underside of the IC device. A first heat sink is positioned above the IC device and a second heat sink is positioned below the IC device. The second heat sink conducts heat from the underside of the IC device to the first heat sink above the IC device.

DETAILED DESCRIPTION OF THE INVENTION

Figure 1:
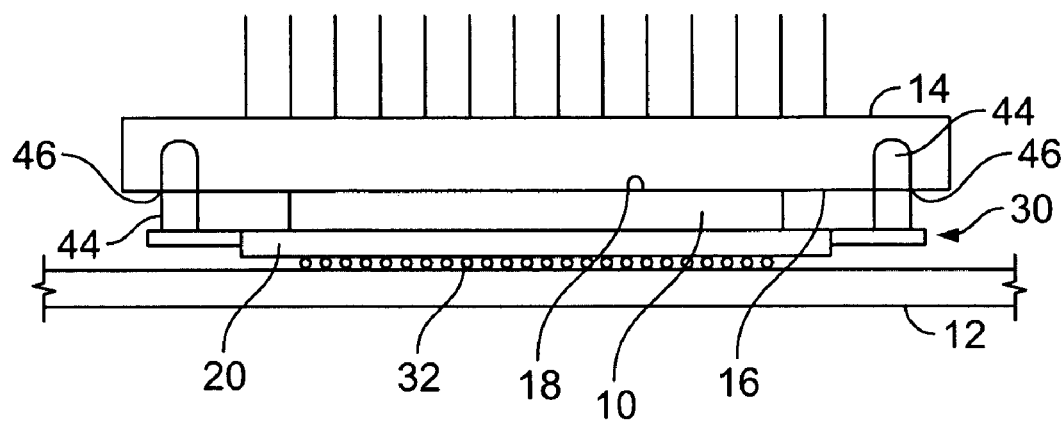
FIG. 1 is a side view of an IC device mounted to a circuit board using a thermal management system formed in accordance with an exemplary embodiment of the present invention.

FIG. 1 illustrates a side view of an exemplary installation of an IC device 10 on a circuit board 12. A heat sink 14 is positioned above the IC device 10 with an underside 16 of the heat sink 14 in contact with an upper surface 18 of the IC device 10 to extract heat from the IC device 10. A fan (not shown) may also be mounted above the heat sink 14 for enhanced cooling of the IC device 10. Heat sinks such as heat sink 14 are well known and are commonly used for removing heat generated from within the IC device 10. The IC device 10 is mounted in a socket 20 that includes a thermal management system 30 formed in accordance with an exemplary embodiment of the present invention. Thermal management system 30 is provided to remove heat that is associated with the delivery of power to the IC device 10 and which builds up underneath the IC device 10. While certain aspects of the thermal management system 30 will be described with reference to an IC device in the form of a land grid array (LGA), it is to be understood that other IC device module types, such as pin grid array (PGA) or ball grid array (BGA) module types, are not intended to be excluded. The IC device 10 may be used, among other applications, in a personal computer, or in a server application, or the like.

The socket 20 houses an array of electrical contacts (not shown in FIG. 1) a portion of which are power contacts. A solder ball 32 is provided on each of the contacts so that the socket 20 can be surface mounted to the circuit board 12. The electrical contacts establish electrical connectivity between the circuit board 12 and the IC device 10 with the power contacts delivering electrical power to the IC device 10.

Figure 2:
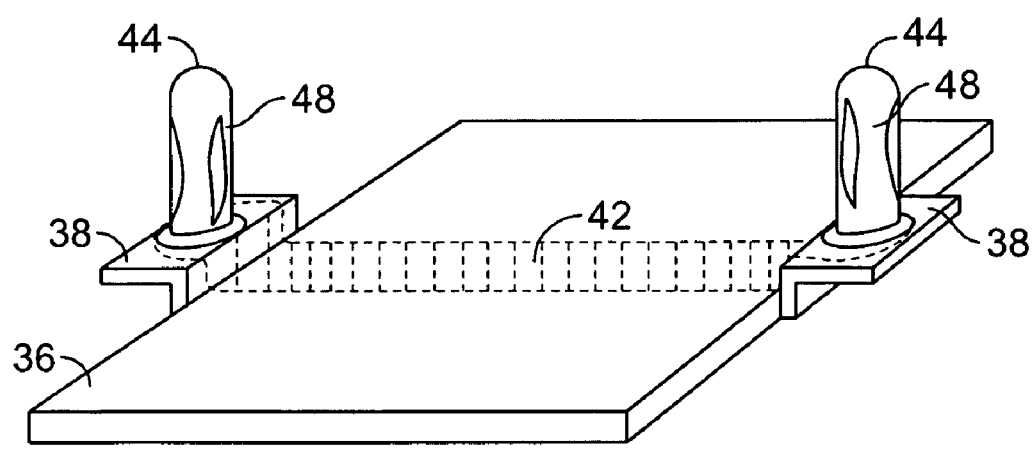
FIG. 2 is a perspective view of the thermal management system shown in FIG. 1.

FIG. 2 illustrates a perspective view of an exemplary embodiment of the thermal management system 30. The system 30 includes a carrier 36 such as, in the case of an LGA module, an LGA socket carrier for the LGA contacts. In the exemplary embodiment, the LGA socket is a metal carrier LGA wherein the carrier 36 is fabricated from a metal such as stainless steel. A pair of wings 38 are attached opposing each other on opposite sides of the carrier 36. The carrier 36 and the wings 38 are sized such that when the IC device 10 (see FIG. 1) is installed in the socket 20, the wings 38 extend beyond the IC device 10 so that a connection to the heat sink 14 can be made. A strip of copper plating 42 is applied across the carrier 36 interconnecting the wings 38. The copper strip 42 provides an enhanced heat flow path for heat that is dissipated into the carrier 36. An upwardly extending thermal connector or thermal lug 44 is attached to each wing 38. The thermal lugs 44 are received in a cavity 46 in the heat sink 14 with an interference fit (see FIG. 1). In the exemplary embodiment, the thermal lugs 44 include shaft portions 48 that exhibit some elasticity so that radial normal forces between the shafts 48 and the heat sink cavity 46 are produced to enhance the flow of heat therebetween. Though illustrated as having two thermal lugs 44, it is to be understood that a greater or lesser number of thermal lugs 44 may be employed.

In use, heat generated from the power contacts within the carrier 36 is dissipated into the carrier 36. The copper plating 42 acts as a thermal conduit providing an enhanced heat flow path from the carrier 36 to the wings 38. Heat is then conducted through the thermal lugs 44 and into the heat sink 14 above the IC device 10 for dissipation into the surrounding air thereby relieving the heat load underneath the IC device 10.

Figure 3:
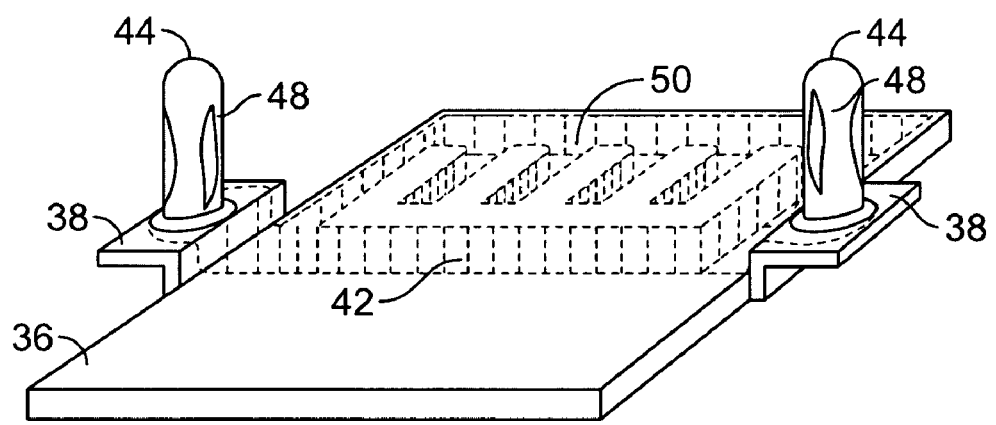
FIG. 3 is a perspective view of the thermal management system shown in FIG. 2 with additional copper plating.

FIG. 3 illustrates the thermal management system 30 shown in FIG. 2 with additional copper plating 50. In an alternative embodiment, additional copper plating 50 may be applied to the stainless steel carrier 36 for improved heat conductivity to the thermal lugs 44 for conveyance to the heat sink 14. The thermal lugs 44 provide a thermal heat conducting link between the carrier 36 and the heat sink 14. Though described in terms of a post type thermal lug 44, it is to be understood that any type of thermally conductive connector may be used as the heat conducting link.

Figure 4:
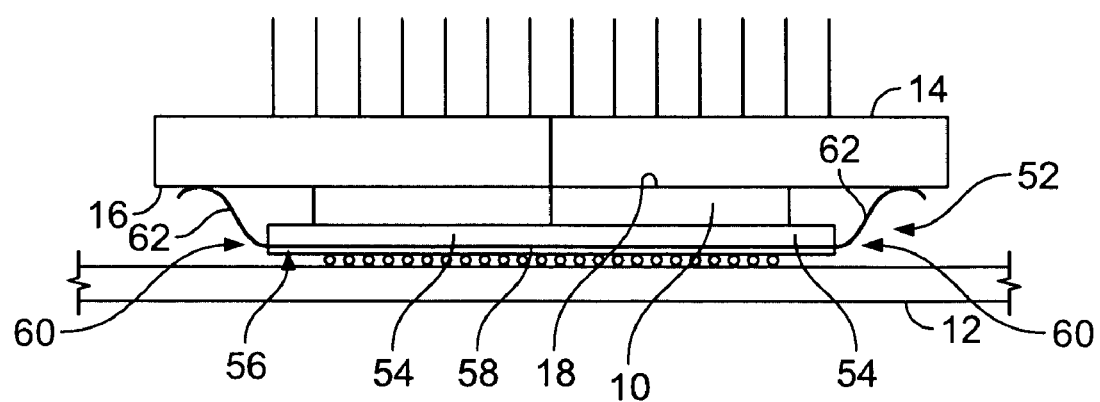
FIG. 4 is a side view of an alternative embodiment of a thermal management system formed in accordance with the present invention.

FIG. 4 illustrates an alternative embodiment of a thermal management system 52. The thermal management system 52 includes a socket 54 that is surface mounted to the circuit board 12. The heat sink 14 is mounted in engagement with the upper surface 18 of the IC device 10. The socket 54 includes a thermal conduit 56 that is positioned within the contact field (see FIG. 5) to absorb heat from the power contacts and convey the heat to the heat sink 14 for dissipation to the surrounding air. The thermal conduit 56 includes a central heat absorbing body portion 58 that extends between first and second ends 60. The ends 60 include thermal links 62 that engage the underside 16 of the heat sink 14 to conduct heat from the thermal conduit 56 to the heat sink 14. In an exemplary embodiment, the heat absorbing body portion 58 is a thermally conductive polymer and the thermal links 62 are flexible spring links that apply a normal force to the underside 16 of the heat sink 14 to enhance the heat transfer process. In alternative embodiments, the body portion 58 can be a metallic strip embedded in the socket 54.

Figure 5:
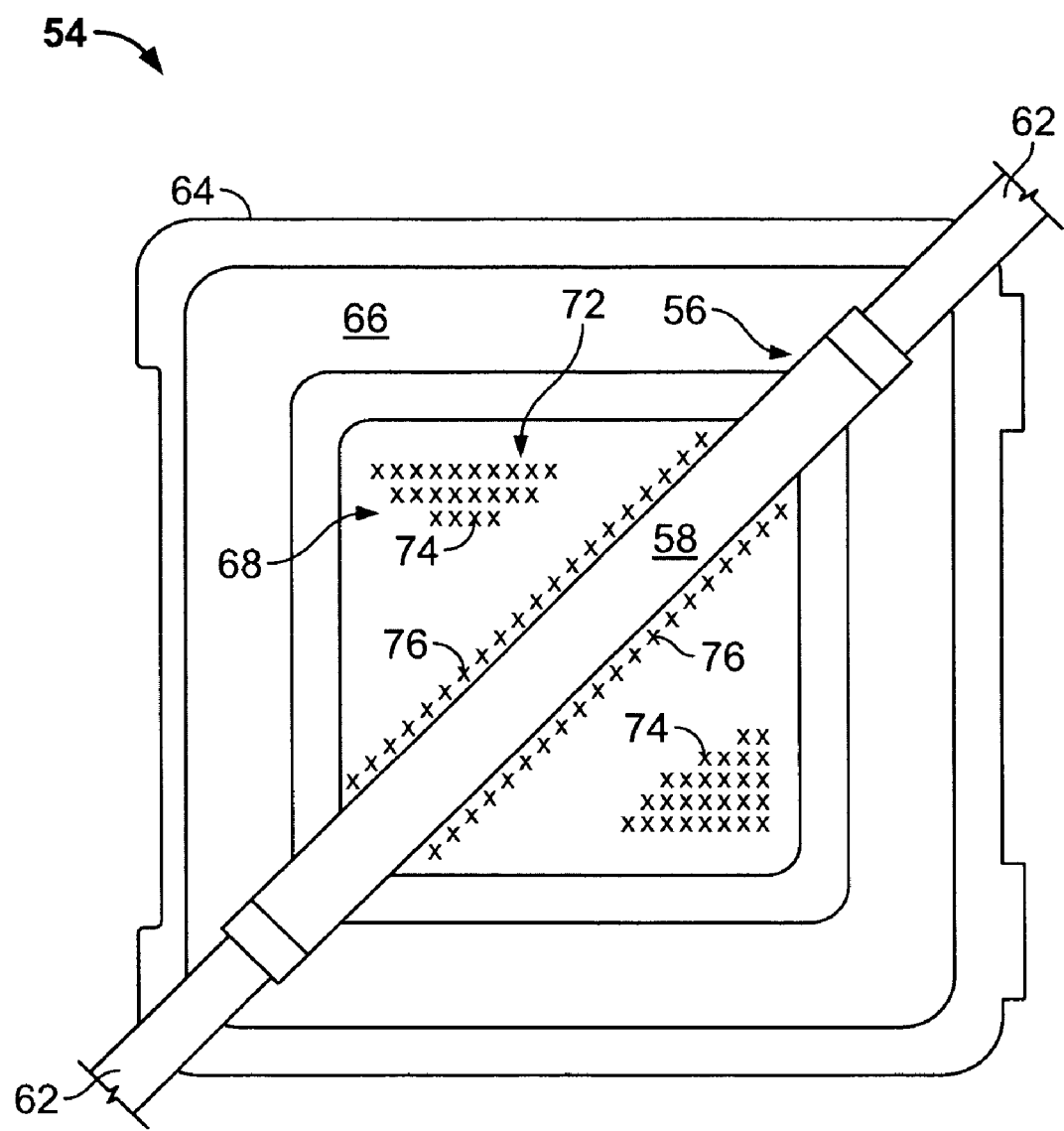
FIG. 5 illustrates a top view of the socket of the thermal management system shown in FIG. 4.

FIG. 5 illustrates a top view of the socket 54. The socket 54 includes a housing 64 and a base 66 that fabricated from a dielectric material. The base 66 includes a contact field 68 that includes an array of contact cavities that hold an array 72 of individual electrical contacts 74 some of which are power contacts 76 that deliver power to the IC device 10 (see FIG. 4). The body portion 58 of the thermal conduit 56 is embedded in the dielectric material of base 66 and extends through the contact field 68. The power contacts 76 are positioned proximate the thermal conduit body 58. In one embodiment, the power contacts 76 can be inserted into a pre-molded housing. In an alternative embodiment, the power contacts 76 can be insert molded as a subassembly to the IC device 10. The thermal conduit body 58 can be fabricated from a thermally conductive material such as a metal strip or a thermally conductive polymer. In an exemplary embodiment the thermal conduit 56 is a copper strip.

Figure 6:
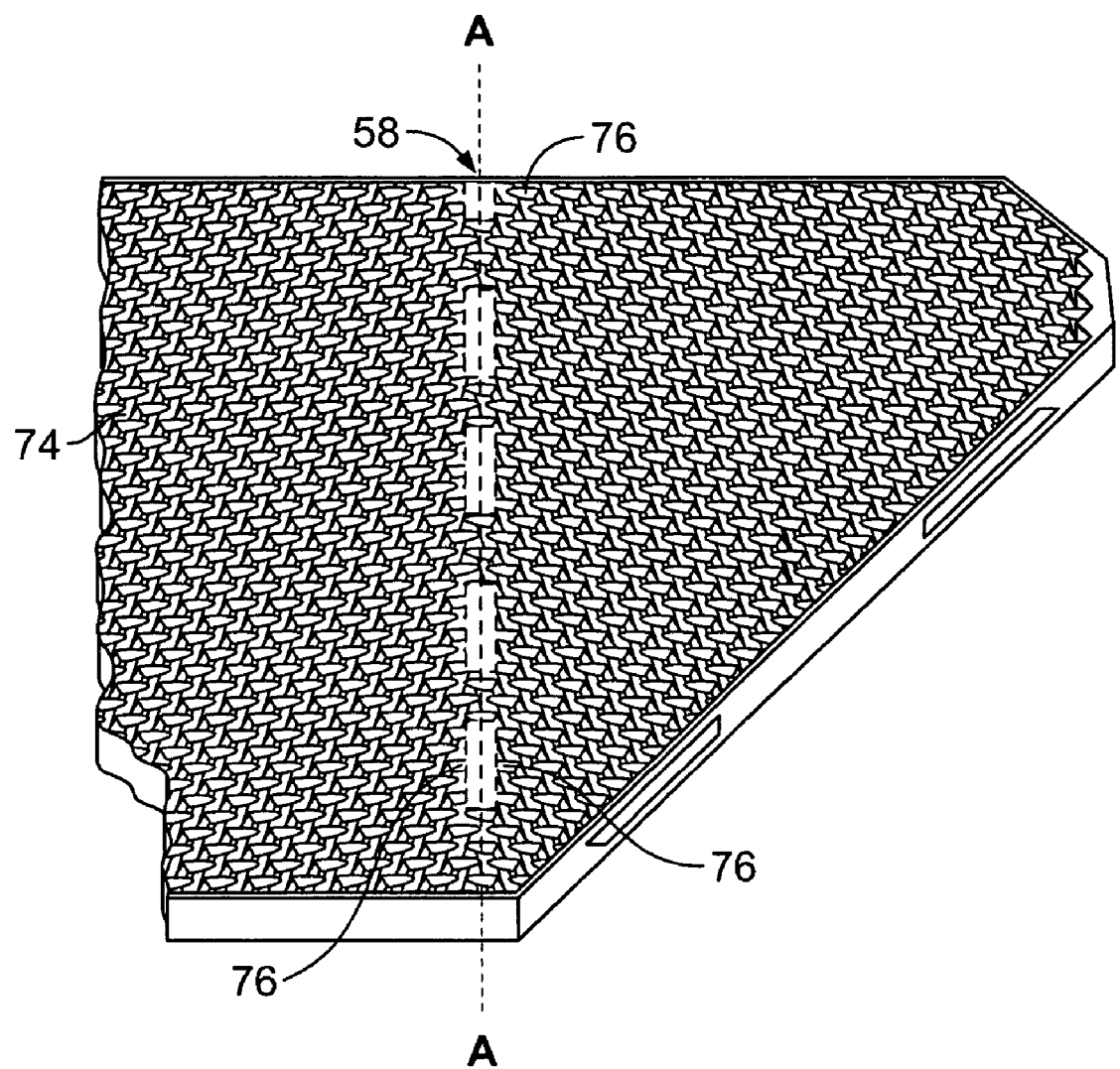
FIG. 6 illustrates an enlarged view of a portion of the socket shown in FIG. 5.

FIG. 6 illustrates an enlarged view of a portion of the contact field 68 of the socket 54 shown in FIG. 5. In FIG. 6, thermal conduit body 58 extends through the dielectric base 66 along the path indicated by the line A—A. In the exemplary embodiment, power contacts 76 partially lean over the path of the thermal conduit body 58. In use, the heat generated in the power contacts 76 is dissipated into the thermal conduit body 58 and directed to the thermal links 62 at the ends 60 of the thermal conduit 56. The thermal links 62 are in contact with the heat sink 14 so that the heat is conveyed to the heat sink 14 for dissipation into the surrounding air.

Figure 7:
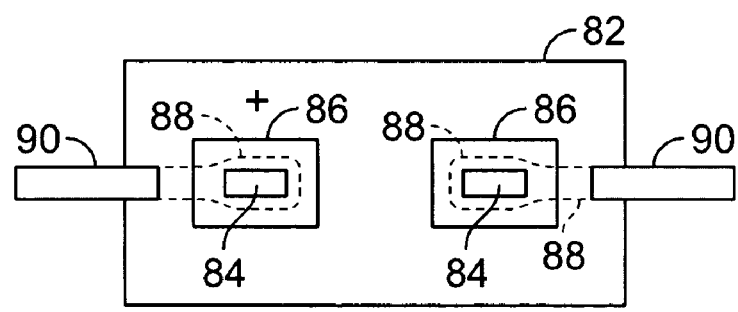
FIG. 7 is a partial top view of a second alternative embodiment of a thermal management system formed in accordance with the present invention.

FIG. 7 illustrates a partial top view of a second alternative embodiment of a thermal management system 80. The system 80 includes a IC device socket (not shown) that includes a contact carrier 82 which, in an exemplary embodiment, is fabricated from stainless steel. Individual power contacts 84 are surrounded by a phase change material 86. The phase change material 86 is solid at room temperature and changes to a liquid at a predetermined temperature. In one embodiment, the phase change material 86 is a wax material, several of which are well known by those of ordinary skill in the art. In one embodiment, the phase change occurs at about fifty-five degrees C. Copper plating 88 is applied to the carrier 82 in the areas underneath the phase change material 86 and lead to conductive links 90 which interconnect the carrier 82 with a heat sink (not shown). The copper plating 88 acts as a heat conduit. The connection to the heat sink is by any of the previously described methods. In use, when power is directed through the power contacts 84, heat from the contacts 84 causes the phase change material 86 to melt as heat is absorbed in the phase change material 86. The heat from the phase change material is conveyed through the copper plating 88 on the carrier 82 to the conductive links 90 and thereafter to the heat sink for dissipation to the surrounding air.

Figure 8:
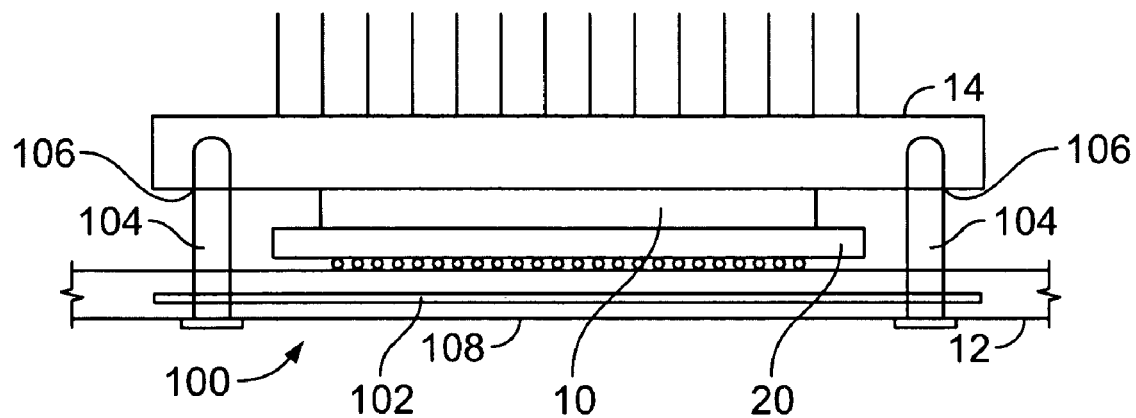
FIG. 8 is a side view of a third alternative embodiment of a thermal management system formed in accordance with the present invention.

FIG. 8 illustrates a third alternative embodiment of a thermal management system 100. As shown in FIG. 8, the IC device 10 is loaded into the socket 20 which is surface mounted on a multi-layered circuit board 12. The heat sink 14 is mounted above and in contact with the IC device 10. The socket 20 includes electrical contacts (not shown), some of which are power contacts for delivering electrical power to the IC device 10. The thermal management system 100 includes an inlay 102 within the circuit board 12. The inlay 102 is positioned between layers of the circuit board. The inlay is fabricated from a heat conductive material such as graphite. Alternatively, the inlay 102 can be made from carbon fiber or similar materials. Heat conducting links 104 extend through the circuit board 12, through the inlay 102 and are received in cavities 106 in the heat sink 14. With the system 100, heat generated by the power contacts is dissipated back into the circuit board where it is absorbed by the inlay 102 and conveyed by the links 104 to the heat sink 14 for dissipation to the surrounding air. In an alternative embodiment, the inlay 102 could be attached to the underside 108 of the circuit board 12. The size of the inlay 102 can be varied along with the number of heat conducting links 104 to tailor the thermal management system 100 for a total heat dissipation level.

The embodiments thus described provide a thermal management system that conducts heat from the underside of an IC device that results from the application of power to run the IC device. The heat from the power contacts in the IC device socket is dissipated into a thermal conduit which conveys the heat to a heat sink above the IC device. Copper plating is employed along the heat flow paths for enhanced heat conductivity.

While the invention has been described in terms of various specific embodiments, those skilled in the art will recognize that the invention can be practiced with modification within the spirit and scope of the claims.

What is claimed is:

1. A thermal management system for an IC device mounted on a circuit board, said system comprising:
   a socket housing;
   an array of power contacts disposed within said housing, said power contacts delivering power to an underside of the IC device and generating heat at said underside of the IC device; and
   a heat conducting interface conveying heat from said underside of the IC device to a heat sink positioned above the IC device, wherein said heat conducting interface comprises a metallic strip extending through said array of power contacts, said strip including first and second opposite ends that extend beyond said housing to engage a lower surface of said heat sink.

2. The thermal management system of claim 1 wherein a thermal connector is coupled to each of said first and second ends of said strip, each said thermal connector including a post received in a cavity in said heat sink.

3. The thermal management system of claim 1 wherein said array of power contacts is encased in a thermally conductive material.

4. A thermal management system for an IC device mounted on a circuit board, said system comprising:
   a socket housing including a plurality of electrical contacts, a portion of said contacts comprising an array of power contacts; and
   a metallic strip extending through said array of power contacts, said metallic strip including first and second opposite ends that extend beyond said housing and are configured to engage a lower surface of a heat sink.

5. The thermal management system of claim 4 wherein said array of power contacts is encased in a thermally conductive material.

6. The thermal mananement system of claim 4 wherein a thermal link is coupled to each of said first and second ends of said strip, each said thermal link including a post received in a cavity in said heat sink.

7. The thermal management system of claim 4 wherein said strip includes a layer of copper plating to define an enhanced heat flow path.

* * * * *